(12) United States Patent
Gupta et al.

(10) Patent No.: US 8,742,849 B1
(45) Date of Patent: Jun. 3, 2014

(54) LINEAR SOURCE FOLLOWER AMPLIFIER

(75) Inventors: Tarun Gupta, Santa Clara, CA (US); Ramesh Kumar Singh, Sunnyvale, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 66 days.

(21) Appl. No.: 13/437,154

(22) Filed: Apr. 2, 2012

(51) Int. Cl.
*H03F 3/16* (2006.01)
*H03F 1/30* (2006.01)

(52) U.S. Cl.
USPC .......................................... 330/277; 330/290

(58) Field of Classification Search
USPC .......................... 330/262, 269, 277, 288, 290
See application file for complete search history.

(56) References Cited

U.S. PATENT DOCUMENTS 7,304,540 B2 * 12/2007 Tu ................................. 330/290
7,459,977 B2 * 12/2008 Takahashi ..................... 330/288

* cited by examiner

*Primary Examiner* — Steven J Mottola
(74) *Attorney, Agent, or Firm* — Amin, Turocy & Watson, LLP

(57) ABSTRACT

A linear source follower amplifier is provided with a first metal-oxide semiconductor (MOS) field effect transistor (FET) having a gate to accept an ac input signal and a source to supply an ac output signal. A second MOS FET has a gate to accept the ac input signal, a source connected to the drain of the first MOS FET. A third MOS FET has a drain connected to the source of the first MOS FET, a gate connected to the drain of the second MOS FET, and a source connected to a first reference voltage. A fourth MOS FET has a drain and a gate connected to the drain of the second MOS FET and a source connected to the first reference voltage. A current source has an input connected to a second reference voltage, and an output connected to the drain of the first MOS FET.

17 Claims, 10 Drawing Sheets

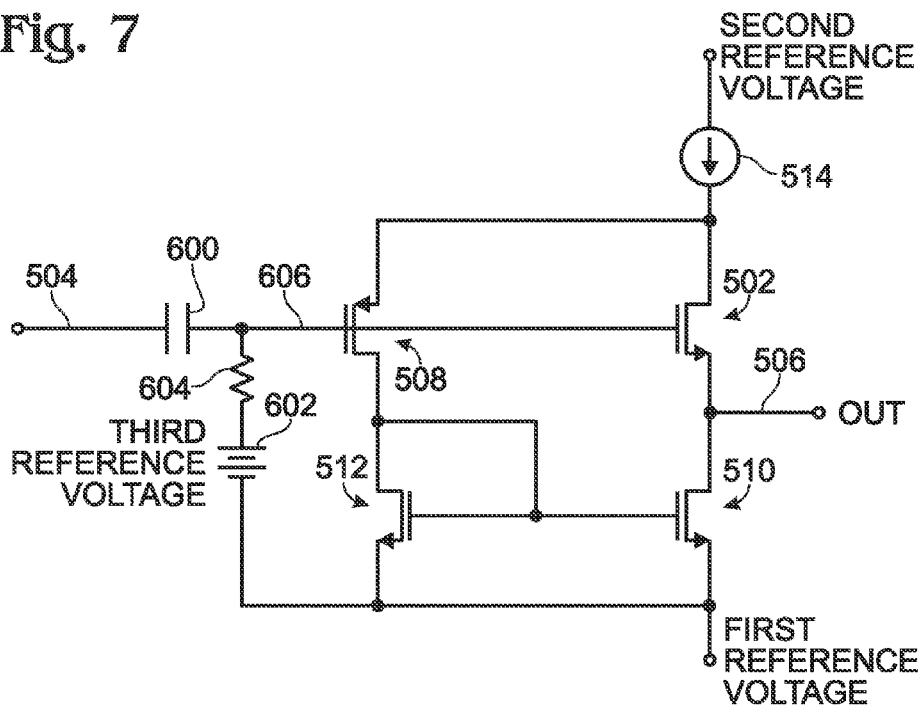
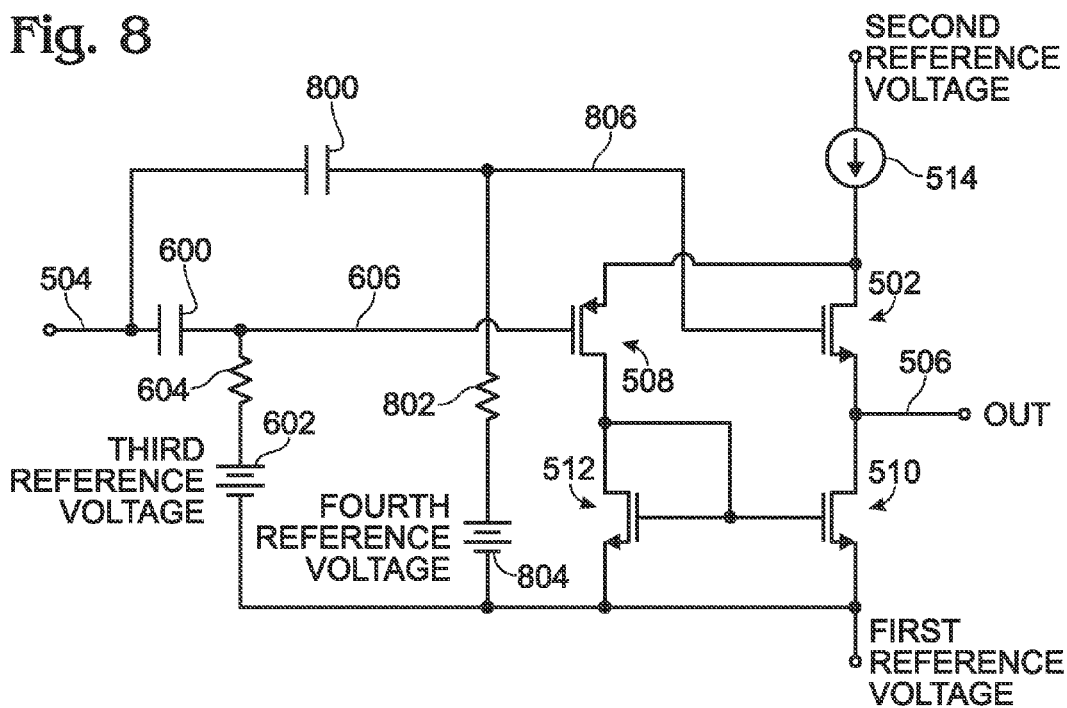

LINEAR SOURCE FOLLOWER AMPLIFIER

BACKGROUND OF THE INVENTION

1. Field of the Invention

This invention generally relates to electronic circuitry and, more particularly, to linear source follower and emitter follower amplifiers.

2. Description of the Related Art

As noted in Wikipedia, a common-collector amplifier (also known as an emitter follower or BJT voltage follower) is one of three basic single-stage bipolar junction transistor (BJT) amplifier topologies, typically used as a voltage buffer. In this circuit the base terminal of the transistor serves as the input, the emitter is the output, and the collector is common to both (for example, it may be tied to ground reference or a power supply rail), hence its name. The analogous field-effect transistor circuit is the common-drain amplifier.

FIG. 1 is a schematic diagram of an emitter follower amplifier (prior art). The circuit can be explained by viewing the transistor as being under the control of negative feedback. From this viewpoint, a common-collector stage is an amplifier with full series negative feedback. In this configuration (with the gain β=1), the entire output voltage $V_{OUT}$ is placed contrary and in series with the input voltage $V_{IN}$. Thus the two voltages are subtracted according to Kirchhoff's voltage law (KVL), the subtractor from the function block diagram is implemented just by the input loop) and their difference Vdiff=$V_{IN}$−$I_{OUT}$ is applied to the base-emitter junction. The transistor monitors continuously Vdiff and adjusts its emitter voltage almost equal (less $V_{BEO}$) to the input voltage by passing the according collector current through the emitter resistor $R_E$. As a result, the output voltage follows the input voltage variations from $V_{BEO}$ up to the $V_+$ supply voltage; hence the name, emitter follower. Intuitively, this behavior can be also understood by realizing that the base-emitter voltage in the bipolar transistor is very insensitive to bias changes, so any change in base voltage is transmitted (to good approximation) directly to the emitter. It depends slightly on various disturbances (transistor tolerances, temperature variations, load resistance, collector resistor if it is added, etc.) since the transistor reacts to these disturbances and restores the equilibrium. It never saturates even if the input voltage reaches the positive rail.

The common collector circuit can be shown mathematically to have a voltage gain of almost unity:

$$A_v = V_{Out}/V_{in} \approx 0$$

A small voltage change on the input terminal will be replicated at the output (depending slightly on the transistor's gain and the value of the load resistance; see gain formula below). This circuit is useful because it has a large input impedance, so it will not load down the previous circuit:

$$r_{in} \approx \beta_0 R_E$$

and a small output impedance, so it can drive low-resistance loads:

$$r_{out} \approx R_E \| R_{source}/\beta_0$$

Typically, the emitter resistor is significantly larger and can be removed from the equation:

$$r_{out} \approx R_{source}/\beta_0$$

The amplifier functions as a voltage buffer. In other words, the circuit has current gain (which depends largely on the $h_{FE}$ of the transistor) instead of voltage gain. A small change to the input current results in much larger change in the output current supplied to the output load.

FIG. 2 is a schematic diagram of a source follower amplifier (prior art). The basic source follower has two problems. A change in input signal swing causes the Vds of M1 to change. The transistor has a finite gds that is a function of Vds and causes nonlinearity with swing. In order to provide more current to load, the current I needs to be increased, which causes increase in power dissipation.

FIG. 3 is a schematic diagram of a source follower amplifier with a constant Vds (prior art). The first of the above-mentioned problems is solved by using transistor M2 in parallel to M1, which keeps Vds across M1 constant and eliminates non-linearity due to gds of M1.

FIG. 4 is a schematic diagram of a power efficient source follower with adaptive biasing (prior art). The second of the above-mentioned problems is solved by using a current feedback loop to provide N·I current to the load, hence, improving settling bandwidth and nonlinearity performance at same power compared to architecture in FIG. 2. However this architecture still has limitations due to finite gds of M1.

It would be advantageous if a source follower amplifier could be designed that effectively addressed the problems associated with a non-constant Vds, power efficiency, and finite gain.

SUMMARY OF THE INVENTION

Accordingly, a linear source follower amplifier is provided with a first metal-oxide semiconductor (MOS) field effect transistor (FET) having a gate to accept an ac input signal, a drain, and a source to supply an ac output signal. A second MOS FET has a gate to accept the ac input signal, a source connected to the drain the first MOS FET, and a drain. A third MOS FET has a drain connected to the source of the first MOS FET, a gate connected to the drain of the second MOS FET, and a source connected to a first reference voltage. A fourth MOS FET has a drain and a gate connected to the drain of the second MOS FET, and a source connected to the first reference voltage. If the second MOS FET is PMOS, the first, third and fourth MOS FETs are NMOS, and the second reference voltage is higher in potential than the first reference voltage. If the second MOS FET is NMOS, the first, third, and fourth MOS FETs are PMOS, and the second potential is lower than the first potential. A current source has an input connected to a second reference voltage, and an output connected to the drain of the first MOS FET.

In one aspect, a first capacitor has a first terminal to accept an unbiased ac input signal and a second terminal connected to the gate of the second MOS FET. A first resistor has a first terminal connected to a third reference voltage, and a second terminal connected to the gate of the second MOS FET. The gate of the second MOS FET accepts a first biased ac input signal.

Additional details of the above-described source follower and equivalent emitter follower amplifiers are presented below.

BRIEF DESCRIPTION OF THE DRAWINGS

FIG. 7 is a schematic diagram depicting a second variation of the source follower of FIG. 5A.

FIG. 8 is a schematic diagram depicting a third variation of the source follower of FIG. 5A.

DETAILED DESCRIPTION

Figure 1:
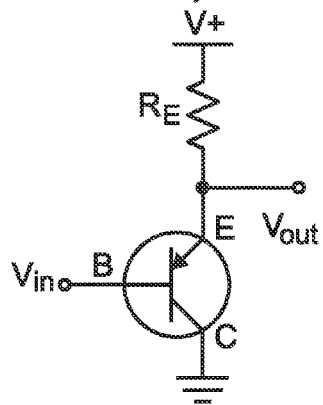
FIG. 1 is a schematic diagram of an emitter follower amplifier (prior art).
Figure 2:
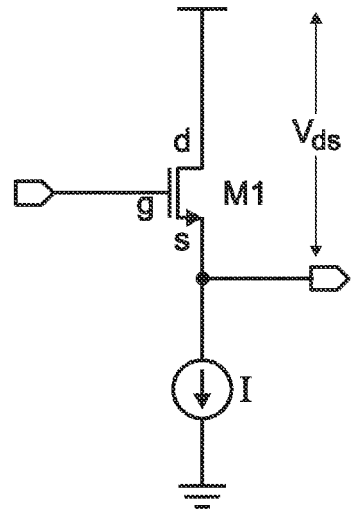
FIG. 2 is a schematic diagram of a source follower amplifier (prior art).
Figure 3:
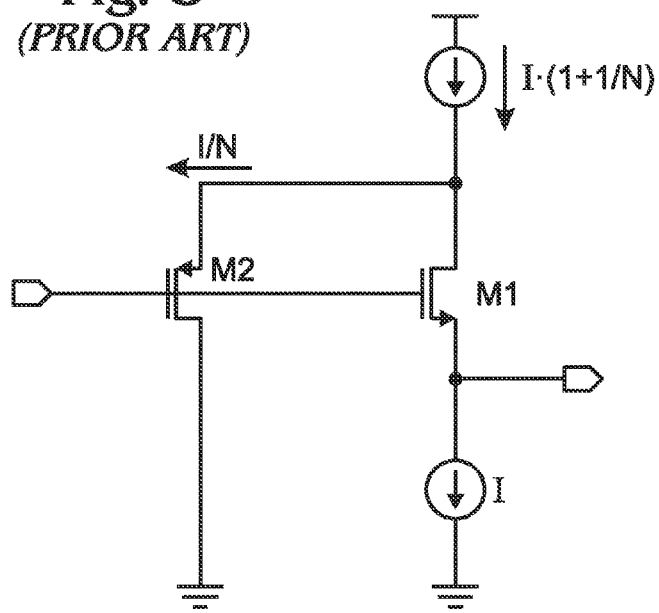
FIG. 3 is a schematic diagram of a source follower amplifier with a constant Vds (prior art).
Figure 4:
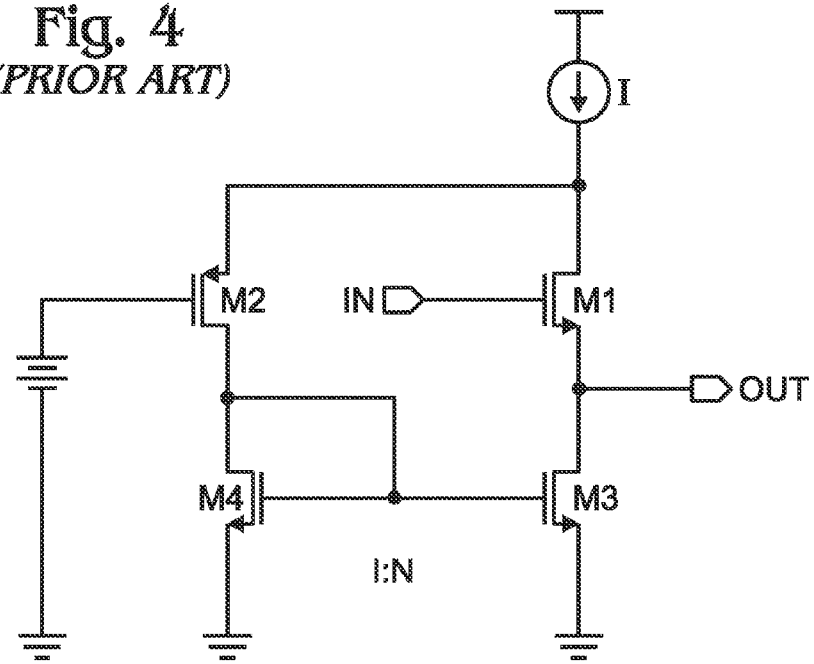
FIG. 4 is a schematic diagram of a power efficient source follower with adaptive biasing (prior art).
Figure 5A:
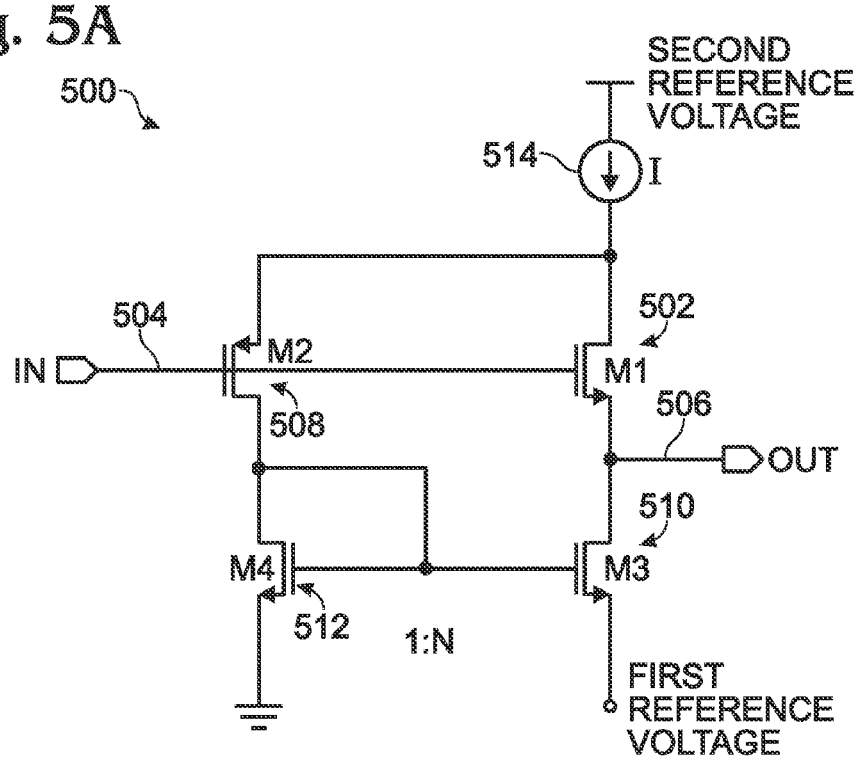
FIGS. 5A and 5B are schematic drawings of a linear source follower amplifier.
Figure 5B:
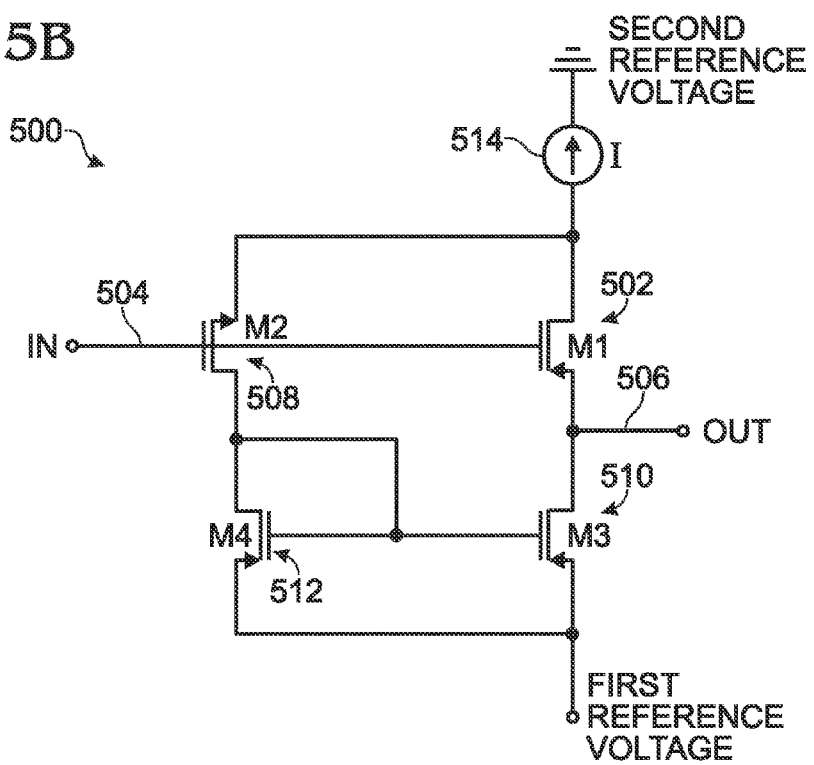

FIGS. 5A and 5B are schematic drawings of a linear source follower amplifier 600. A first metal-oxide, semiconductor (MOS) field effect transistor (FET) 502 (M1) has a gate to accept an ac input signal on line 504, a drain, and a source to supply an ac output signal on line 506. A second MOS FET 508 (M2) has a gate to accept the ac input signal on line 504, a source connected to the drain of the first MOS FET 502, and a drain. A third MOS FET 510 (M3) has a drain connected to the source of the first MOS FET 502, a gate connected to the drain of the second MOS FET 508, and a source connected to a first reference voltage. A fourth MOS FET 512 (M4) has a drain and a gate connected to the drain of the second MOS FET 508, and a source connected to the first reference voltage. A current source 514 has an input connected to a second reference voltage, and an output connected to the drain of the first MOS FET 502. Note: a number of current source designs are known in the art that would enable the source follower 500.

In FIG. 5A the first MOS FET 502, third MOS FET 510, and the fourth MOS FET 512 are NMOS FETs, and the second reference voltage has a higher potential than the first voltage. In FIG. 5B the first MOS FET 502, third MOS FET 510, and the fourth MOS FET 512 are PMOS FETs, and the second reference voltage has a lower potential than the first voltage.

Referencing either FIG. 5A or 5B, the input on line 504 is connected to gate of FET 508, in addition to the gate of MOS FET 502. The Vgs of device 508 is approximately constant, ensuring that the source node of 508 (same as drain node of 502) tracks the input signal thereby minimizing the signal dependent variation of Vds of device 502 by at least an order of magnitude. This substantially reduces the nonlinearity arising from Vds variation of device 502 with ac signal swing. The amplifier also has the current feedback loop to provide N·I current to reduce the power dissipation for a given load current.

Figure 6:
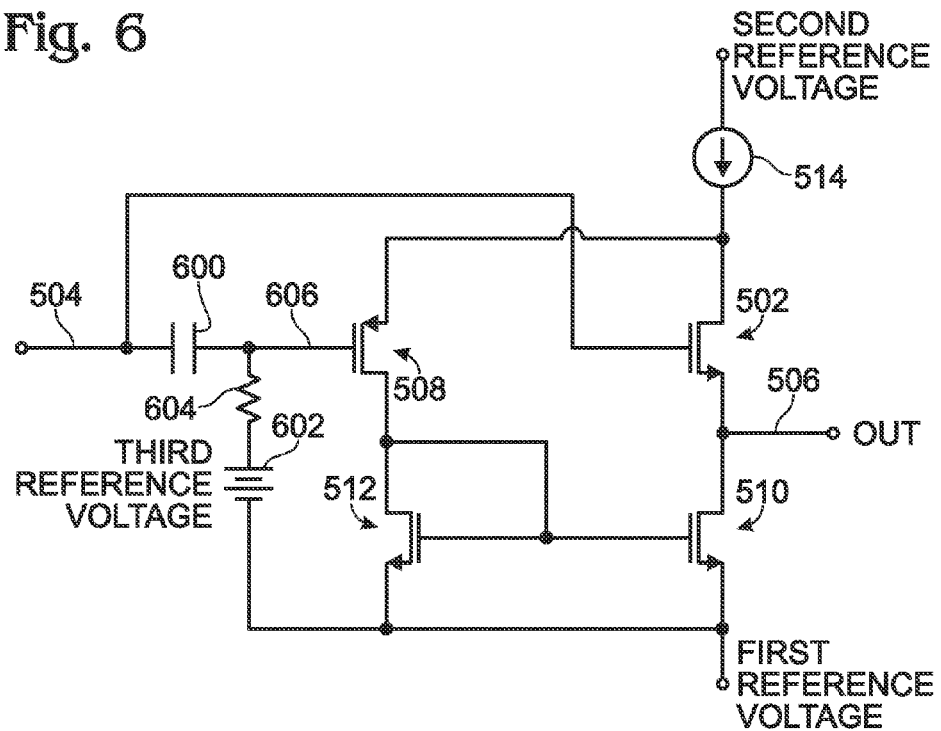
FIG. 6 is a schematic diagram depicting a first variation of the source follower of FIG. 5A.

FIG. 6 is a schematic diagram depicting a first variation of the source follower of FIG. 5A. A first capacitor 600 has a first terminal to accept an unbiased ac input signal on line 504 and a second terminal connected to the gate of the second MOS FET 508. A first resistor 604 has a first terminal connected to a third reference voltage 602, and a second terminal connected to the gate of the second MOS FET 508. Thus, the gate of the second MOS FET 508 accepts a first biased ac input signal on line 606. Note: although not explicitly shown, an equivalent circuit exists for the source follower of FIG. 5B, as would be understood by those with skill in the art. Also note that is this aspect, the third reference voltage has a higher potential than the second reference voltage.

The capacitor 600 and resistor 604 provide ac coupling from the input on line 504 to device 508. This arrangement permits MOS FET 508 to have an independent bias voltage, enabling the design to have optimal headroom for MOS FETs 502 and 608, and current source 514.

FIG. 7 is a schematic diagram depicting a second variation of the source follower of FIG. 5A. In this aspect, the first capacitor 600 second terminal and the first resistor 604 second terminal are connected to the gate of the first MOS FET 502. The first MOS FET 502 gate accepts the first biased ac input signal on line 606. Note: although not explicitly shown, an equivalent circuit exists for the source follower of FIG. 5B, as would be understood by those with skill in the art. Also note that in this aspect the third reference voltage has a higher potential than the second reference voltage.

FIG. 8 is a schematic diagram depicting a third variation of the source follower of FIG. 5A. A first capacitor 600 has a first terminal to accept an unbiased ac input signal on line 504 and a second terminal connected to the gate of the second MOS FET 508 on line 606. A first resistor 604 has a first terminal connected to a third reference voltage, and a second terminal connected to the gate of the second MOS FET 508. The gate of the second MOS FET 508 accepts a first biased ac input signal on line 606. A second capacitor 800 has a first terminal to accept the unbiased ac input signal on line 504 and a second terminal connected to the gate of the first MOS FET 502 on line 806. A second resistor 802 has a first terminal connected to a fourth reference voltage 804, and a second terminal connected to the gate of the first MOS FET 502. The first MOS FET 502 gate accepts a second biased ac input signal. Note: although not explicitly shown, an equivalent circuit exists for the source follower of FIG. 5B, as would be understood by those with skill in the art. Also note that is this aspect, the third and fourth reference voltages have a higher potential than the second reference voltage.

Figure 9:
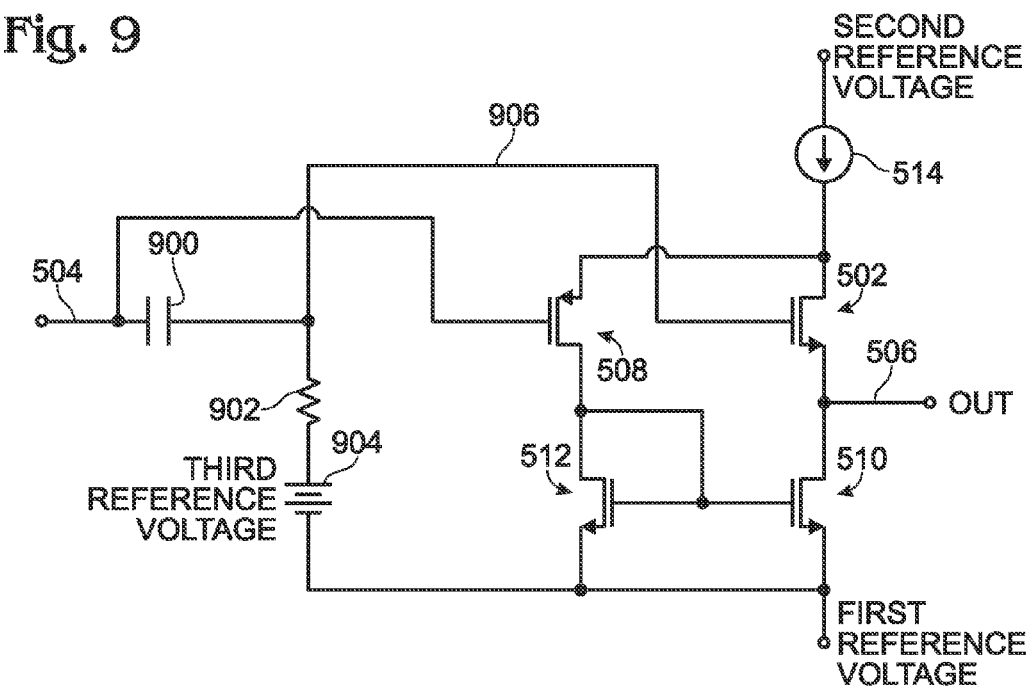
FIG. 9 is a schematic diagram depicting a fourth variation of the source follower of FIG. 5A.

FIG. 9 is a schematic diagram depicting a fourth variation of the source follower of FIG. 5A. In this aspect, a capacitor 900 has a first terminal to accept an unbiased ac input signal on line 504 and a second terminal connected to the gate of the first MOS FET 502 on line 906. A resistor 902 has a first terminal connected to the third reference voltage 904, and a second terminal connected to the gate of the first MOS FET 502. Note: although not explicitly shown, an equivalent circuit exists for the source follower of FIG. 5B, as would be understood by those with skill in the art. Also note that is this aspect, the third reference voltage has a higher potential than the second reference voltage.

Figure 10:
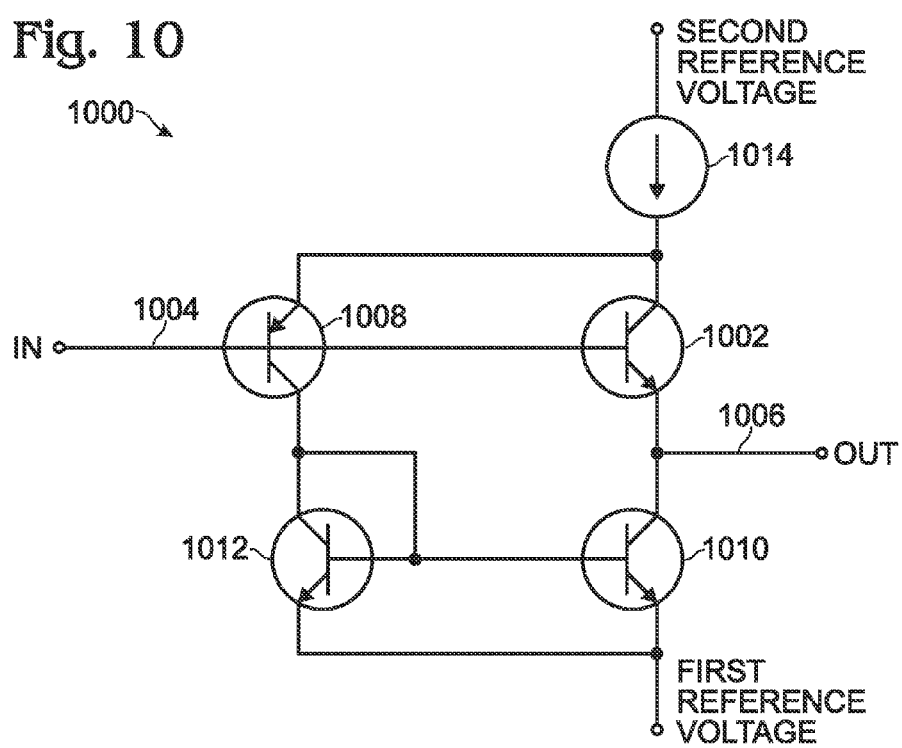
FIG. 10 is a schematic diagram depicting a linear emitter follower amplifier.

FIG. 10 is a schematic diagram depicting a linear emitter follower amplifier 1000. The amplifier 1000 comprises a first n-p-n transistor 1002 having a base to accept an ac input signal on line 1004, a collector, and an emitter to supply an ac output signal on line 1006. A first p-n-p transistor 1008 has a base to accept the ac input signal on line 1004, an emitter connected to the collector of the first n-p-n transistor 1002, and a collector. A second n-p-n transistor 1010 has a collector connected to the emitter of the first n-p-n transistor 1002, a base connected to the collector of the first p-n-p transistor 1008, and an emitter connected to a first reference voltage. A third n-p-n transistor 1012 has a collector and base connected to the collector of the first p-n-p transistor 1008, and an emitter connected to the first reference voltage. A current source 1012 has an input connected to a second reference voltage having a higher voltage potential than the first reference voltage, and an output connected to the collector of the first n-p-n transistor 1002.

Figure 11:
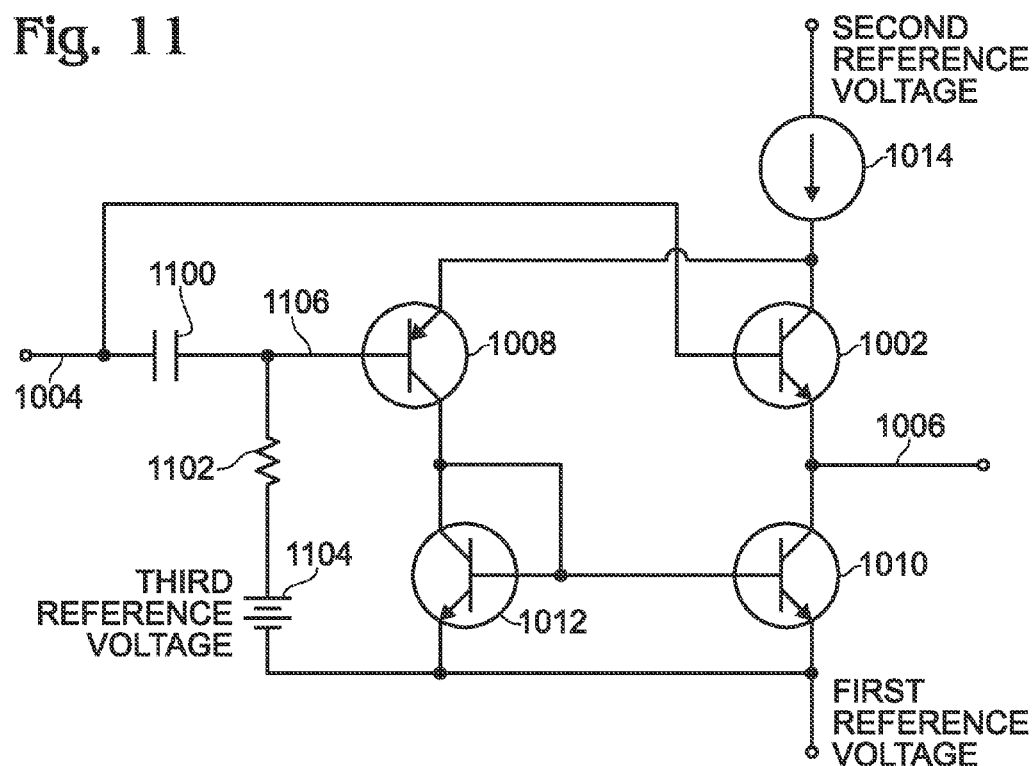
FIG. 11 is a schematic drawing depicting a first variation of the emitter follower of FIG. 10.

FIG. 11 is a schematic drawing depicting a first variation of the emitter follower of FIG. 10. In this aspect, a first capacitor 1100 has a first terminal to accept an unbiased ac input signal on line 1004 and a second terminal connected to the base of the first p-n-p transistor 1008 on line 1106. A first resistor 1102 has a first terminal connected to a third reference voltage 1104 having a higher voltage potential than the first reference voltage, and a second terminal connected to the base of the first p-n-p transistor 1008. The base of the first p-n-p transistor 1008 accepts a first biased ac input signal.

Figure 12:
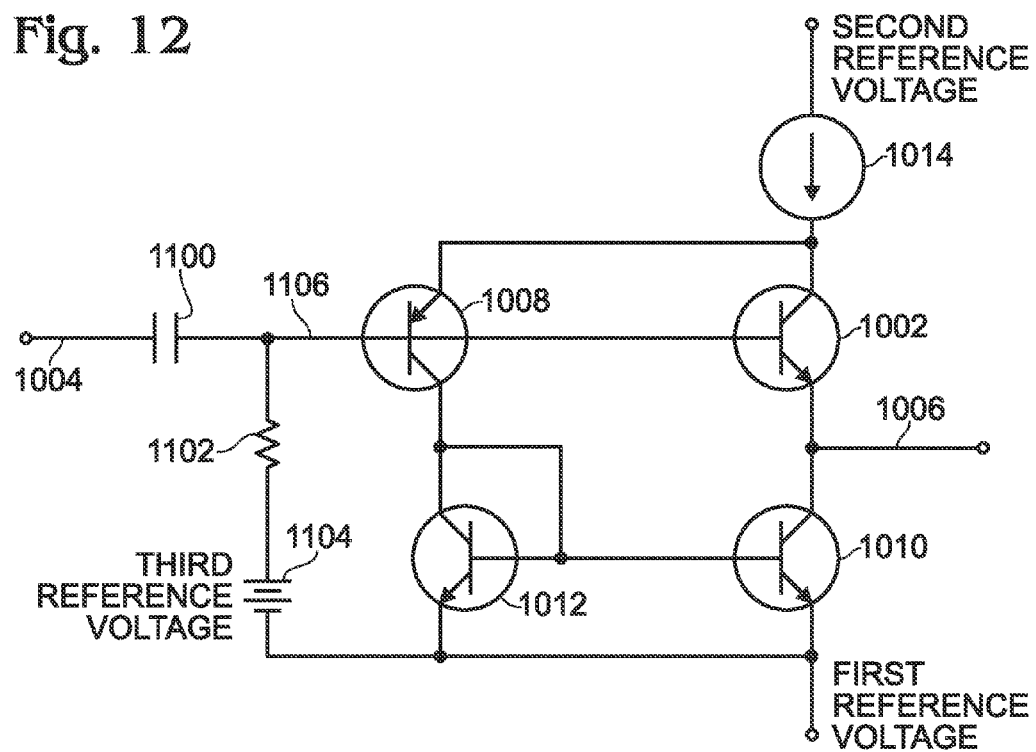
FIG. 12 is a schematic drawing depicting a second variation of the emitter follower of FIG. 10.

FIG. 12 is a schematic drawing depicting a second variation of the emitter follower of FIG. 10. In this aspect, the second terminal of the first capacitor 1100 and the second terminal of the first resistor 1102 are additionally connected to the base of the first n-p-n transistor 1002, as well as to the base of first p-n-p transistor 1008, on line 1106. Thus, the base of the first n-p-n transistor 1002 additionally accepts the first biased ac input signal.

Figure 13:
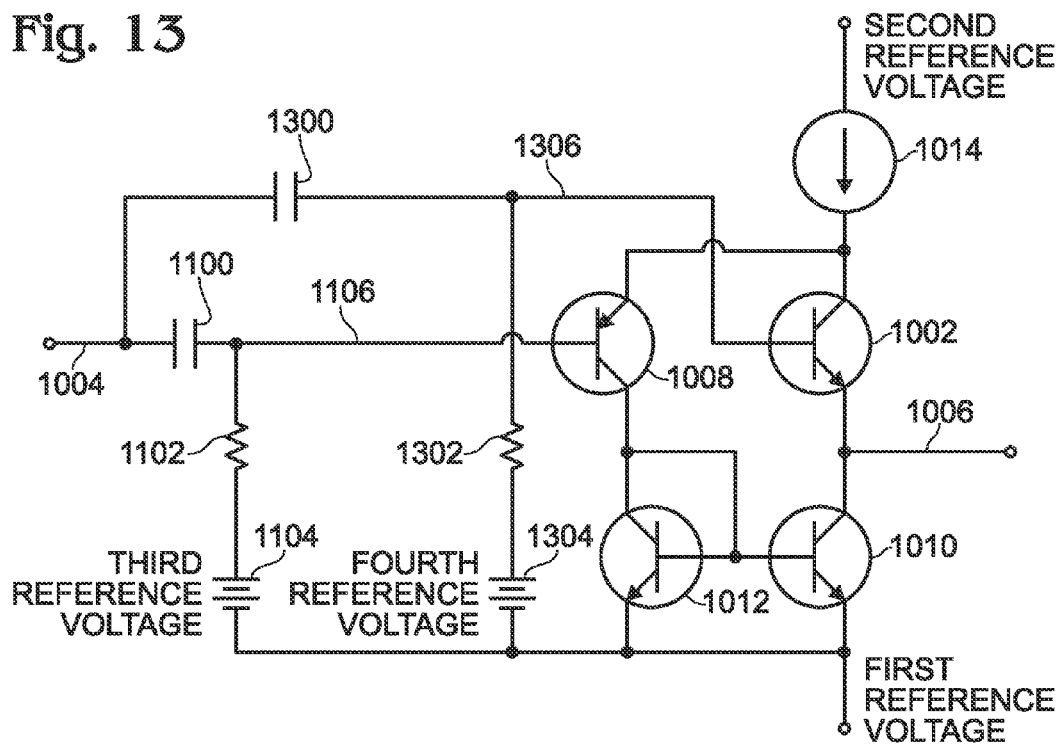
FIG. 13 is a schematic drawing depicting a third variation of the emitter follower of FIG. 10.

FIG. 13 is a schematic drawing depicting a third variation of the emitter follower of FIG. 10. In this aspect, a second capacitor 1300 has a first terminal to accept the unbiased ac input signal on line 1004 and a second terminal connected to the base of the first n-p-n transistor 1002 on line 1306. A second resistor 1302 has a first terminal connected to a fourth reference voltage 1304 having a higher voltage potential than the first reference voltage, and a second terminal connected to the base of the first n-p-n transistor 1002. The base of the first n-p-n transistor 1002 accepts a second biased ac input signal.

Figure 14:
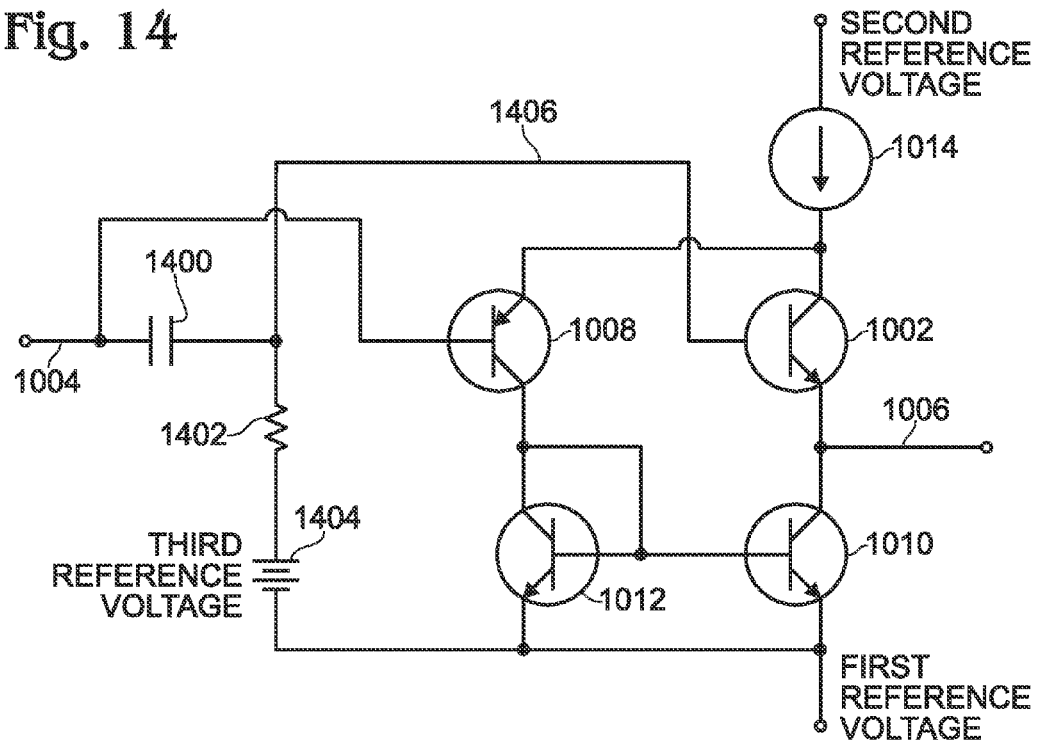
FIG. 14 is a schematic drawing depicting a fourth variation of the emitter follower of FIG. 10.

FIG. 14 is a schematic drawing depicting a fourth variation of the emitter follower of FIG. 10. A capacitor 1400 has a first terminal to accept an unbiased ac input signal on line 1004 and a second terminal connected to the base of the first n-p-n transistor 1002 on line 1406. A resistor 1402 has a first terminal connected to a third reference voltage 1404 having a higher voltage potential than the first reference voltage, and a second terminal connected to the base of the first n-p-n transistor 1002. The base of the first n-p-n transistor 1002 accepts a first biased ac input signal.

Figure 15:
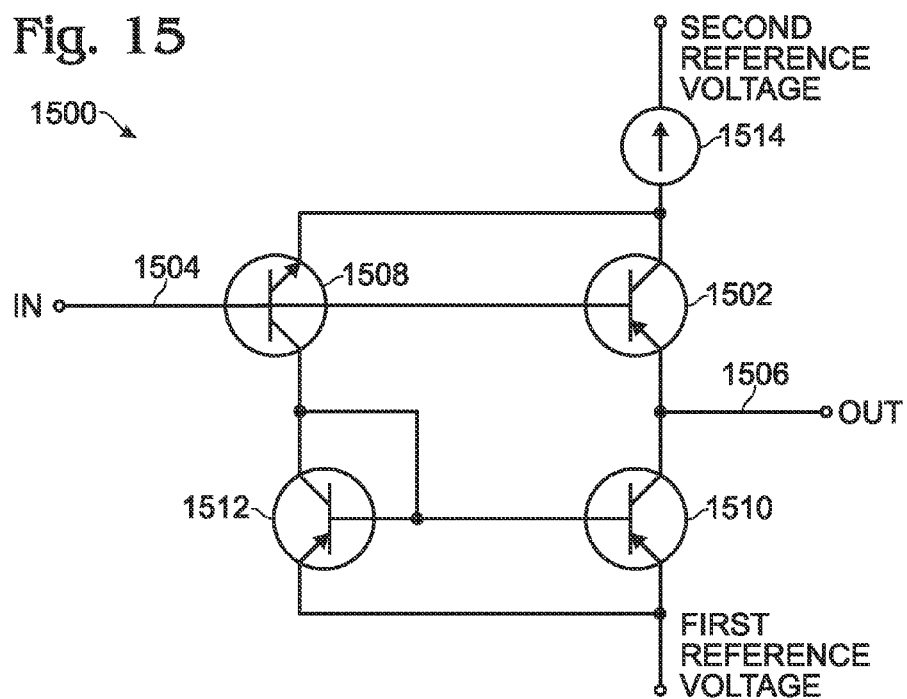
FIG. 15 is a schematic drawing depicting an emitter follower amplifier using primarily p-n-p transistors.

FIG. 15 is a schematic drawing depicting an emitter follower amplifier 1500 using primarily p-n-p transistors. A first p-n-p transistor 1502 has a base to accept an ac input signal on line 1504, a collector, and an emitter to supply an ac output signal on line 1506. A first n-p-n transistor 1508 has a base to accept the ac input signal on line 1504, an emitter connected to the collector of the first p-n-p transistor 1502, and a collector. A second p-n-p transistor 1510 has a collector connected to the emitter of the first p-n-p transistor 1502, a base connected to the collector of the first n-p-n transistor 1508, and an emitter connected to a first reference voltage. A third p-n-p transistor 1512 has a collector and base connected to the collector of the first n-p-n transistor 1508, and an emitter connected to the first reference voltage. A current source 1514 has an output connected to a second reference voltage having a lower voltage potential than the first reference voltage, and an input connected to the collector of the first p-n-p transistor 1502.

Figure 16:
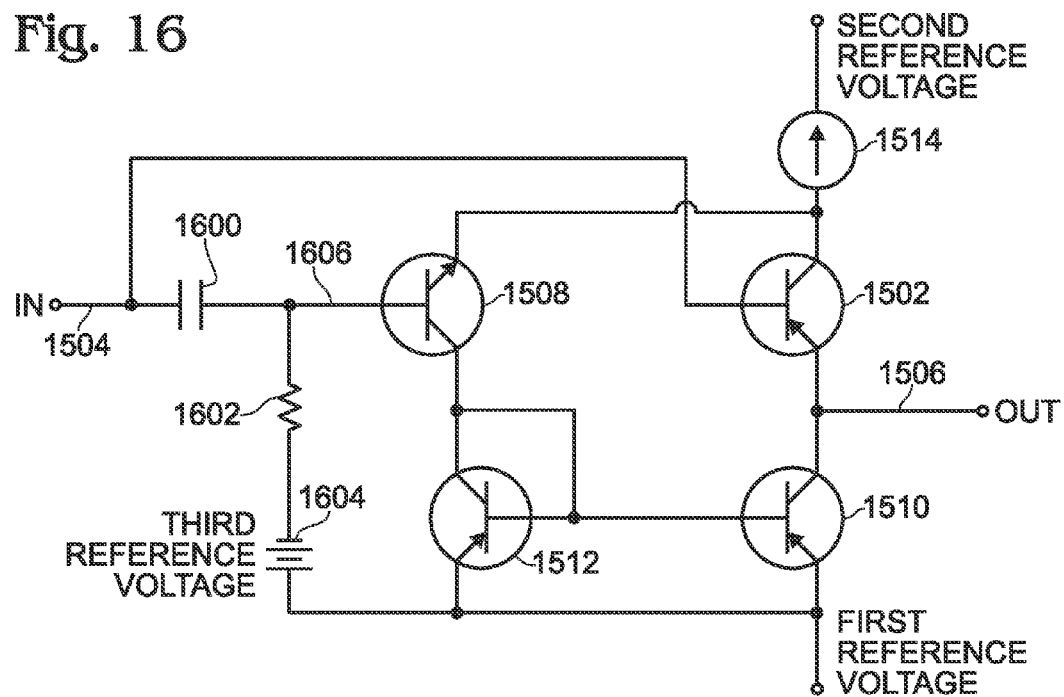
FIG. 16 is a schematic drawing depicting a first variation of the emitter follower of FIG. 15.

FIG. 16 is a schematic drawing depicting a first variation of the emitter follower of FIG. 15. In this aspect, a first capacitor 1600 has a first terminal to accept the unbiased ac input signal on line 1504 and a second terminal connected to the base of the first n-p-n transistor 1508 on line 1606. A first resistor 1602 has a first terminal connected to a third reference voltage 1604 having a lower voltage potential than the first reference voltage, and a second terminal connected to the base of the first n-p-n transistor 1508. The base of the first n-p-n transistor 1508 accepts a first biased ac input signal.

Figure 17:
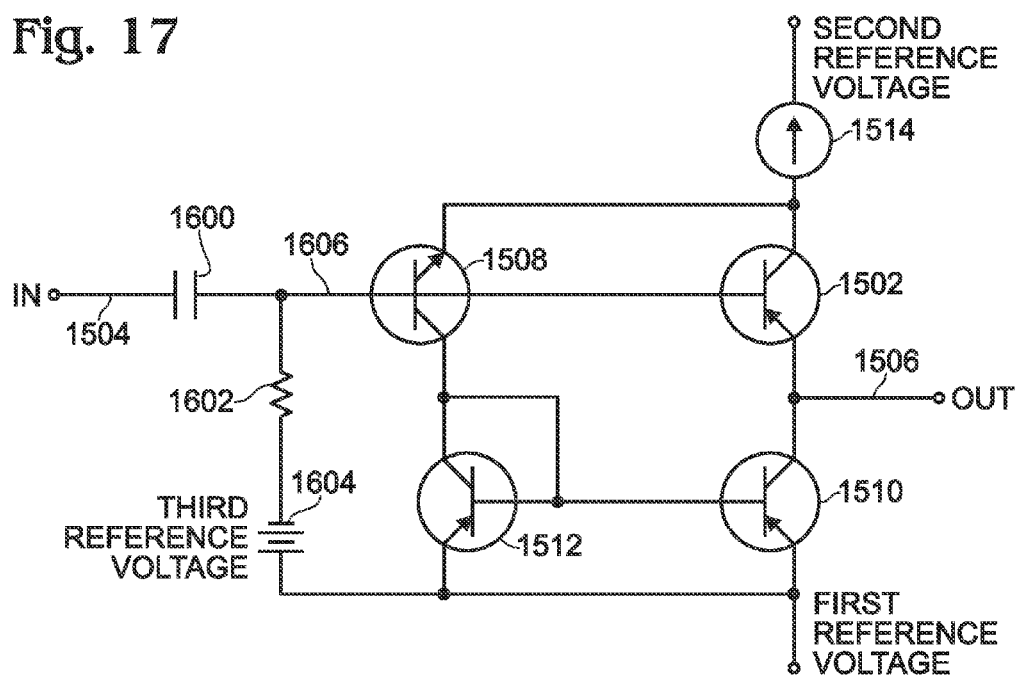
FIG. 17 is a schematic drawing depicting a second variation of the emitter follower of FIG. 15.

FIG. 17 is a schematic drawing depicting a second variation of the emitter follower of FIG. 15. In this aspect, the second terminals of the first capacitor 1600 and first resistor 1602 are additionally connected to the base of the first p-n-p transistor 1502 on line 1606. The base of the first p-n-p transistor 1502 also accepts the first biased ac input signal.

Figure 18:
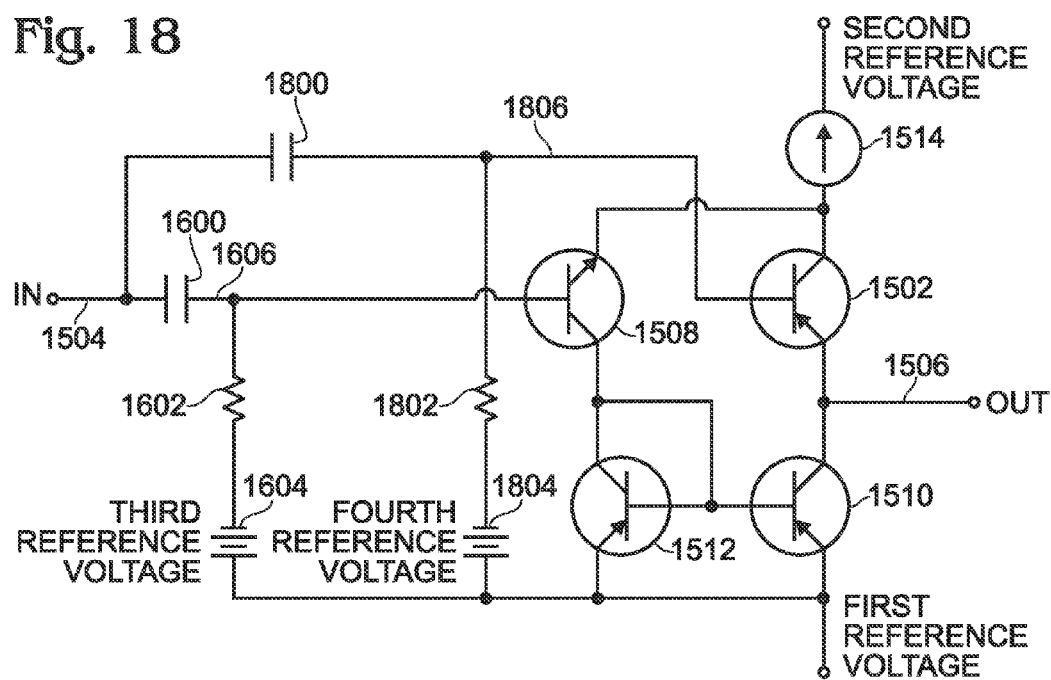
FIG. 18 is a schematic drawing depicting a third variation of the emitter follower of FIG. 15.

FIG. 18 is a schematic drawing depicting a third variation of the emitter follower of FIG. 15. A second capacitor 1800 has a first terminal to accept the unbiased ac input signal on line 1504 and a second terminal connected to the base of the first p-n-p transistor 1502 on line 1806. A second resistor 1802 has a first terminal connected to a fourth reference voltage having lower voltage potential than the first reference voltage, and a second terminal connected to the base of the first p-n-p transistor 1502. The base of the first p-n-p transistor 1502 accepts a second biased ac input signal.

Figure 19:
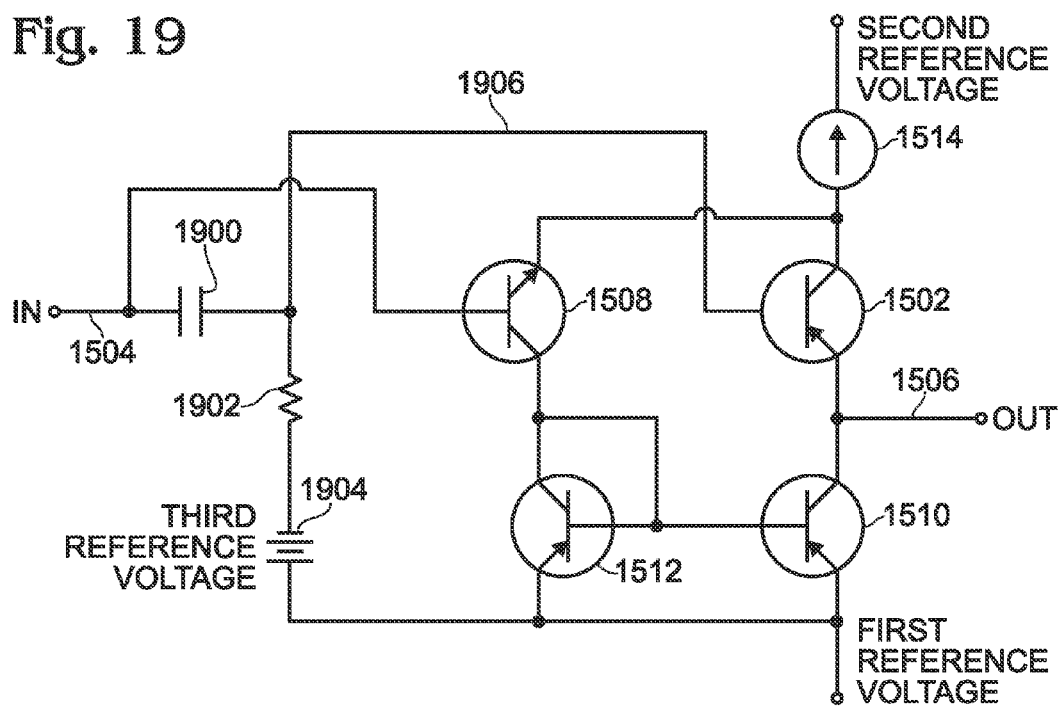
FIG. 19 is a schematic drawing depicting a fourth variation of the emitter follower of FIG. 15.

FIG. 19 is a schematic drawing depicting a fourth variation of the emitter follower of FIG. 15. A capacitor 1900 has a first terminal to accept an unbiased ac input signal on line 1504 and a second terminal connected to the base of the first p-n-p transistor 1502 on line 1906. A resistor 1902 has a first terminal connected to a third reference voltage having a lower voltage potential than the first reference voltage, and a second terminal connected to the base of the first p-n-p transistor 1502. The base of the first p-n-p transistor 1502 accepts a first biased ac input signal.

Figure 20:
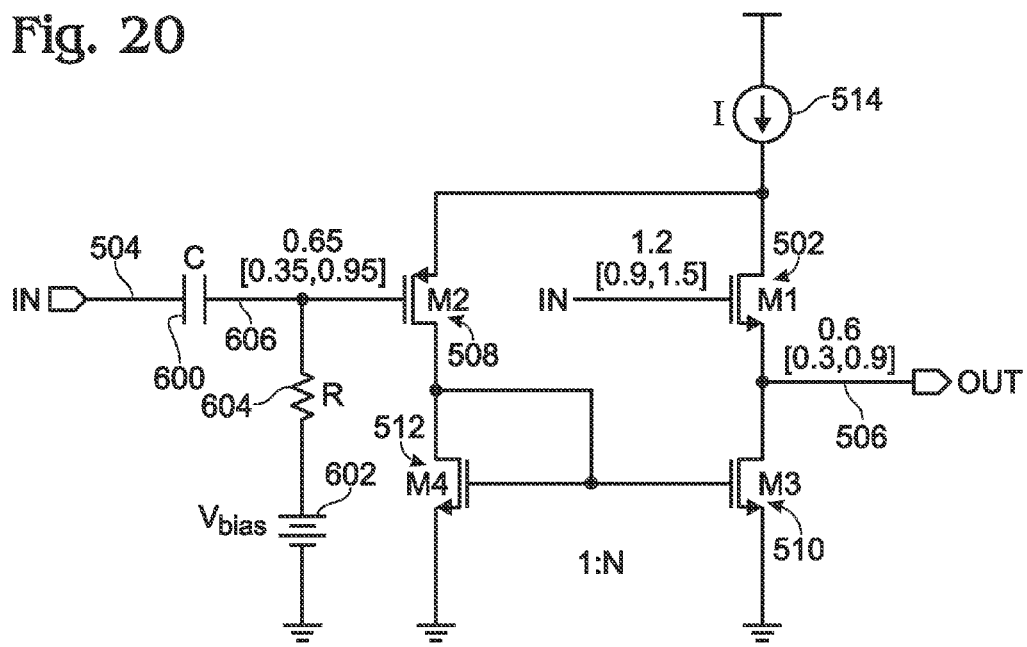
FIG. 20 is a schematic drawing depicting the amplifier of FIG. 6, additionally showing exemplary dc bias and ac voltages.

FIG. 20 is a schematic drawing depicting the amplifier of FIG. 6, additionally showing exemplary dc bias and ac voltages. The ac voltage swings at each node are enclosed by parentheses. For example, on line 606 the dc bias voltage is 0.65 voltages, and the ac voltage swing is between 0.35 and 0.95 volts.

Linear emitter follower and source follower amplifiers have been provided. Examples of particular biasing schemes have been presented to illustrate the invention. However, the invention is not limited to merely these examples. Other variations and embodiments of the invention will occur to those skilled in the art.

We claim:
1. A linear source follower amplifier comprising:
a first metal-oxide semiconductor (MOS) field effect transistor (FET) selected from a group consisting of NMOS and PMOS, having a gate to accept an ac input signal, a drain, and a source to supply an ac output signal;
a second MOS FET selected from the group having a gate to accept the ac input signal, a source connected to the drain the first MOS FET, and a drain;
a third MOS FET selected from the group, having a drain connected to the source of the first MOS FET, a gate connected to the drain of the second MOS FET, and a source connected to a first reference voltage;

a fourth MOS FET selected from the group, having a drain and a gate connected to the drain of the second MOS FET, and a source connected to the first reference voltage; and, a current source having an input connected to a second reference voltage, and an output connected to the drain of the first MOS FET.

2. The amplifier of claim 1 wherein the MOS FETs selected from the group are NMOS FETs, and the second reference voltage has a higher potential than the first voltage.

3. The amplifier of claim 1 wherein the MOS FETs selected from the group are PMOS FETs, and the second reference voltage has a lower potential than the first voltage.

4. The amplifier of claim 1 further comprising:
a first capacitor having a first terminal to accept an unbiased ac input signal and a second terminal connected to the gate of the second MOS FET;
a first resistor having a first terminal connected to a third reference voltage, and a second terminal connected to the gate of the second MOS FET; and,
wherein the gate of the second MOS FET accepts a first biased ac input signal.

5. The amplifier of claim 4 wherein the first capacitor second terminal and the first resistor second terminal are connected to the gate of the first MOS FET; and,
wherein the first MOS FET gate accepts the first biased ac input signal.

6. The amplifier of claim 4 further comprising:
a second capacitor having a first terminal to accept the unbiased ac input signal and a second terminal connected to the gate of the first MOS FET;
a second resistor having a first terminal connected to a fourth reference voltage, and a second terminal connected to the gate of the first MOS FET; and,
where the first MOS FET gate accepts a second biased ac input signal.

7. The amplifier of claim 1 further comprising:
a first capacitor having a first terminal to accept an unbiased ac input signal and a second terminal connected to the gate of the first MOS FET; and,
a first resistor having a first terminal connected to a third reference voltage, and a second terminal connected to the gate of the first MOS FET.

8. A linear emitter follower amplifier comprising:
a first n-p-n transistor having a base to accept an ac input signal, a collector, and an emitter to supply an ac output signal;
a first p-n-p transistor having a base to accept an ac input signal, an emitter connected to the collector the first n-p-n transistor, and a collector;
a second n-p-n transistor having a collector connected to the emitter of the first n-p-n transistor, a base connected to the collector of the first p-n-p transistor, and an emitter connected to a first reference voltage;
a third n-p-n transistor having a collector and base connected to the collector of the first p-n-p transistor, and an emitter connected to the first reference voltage; and,
a current source having an input connected to a second reference voltage having a higher voltage potential than the first reference voltage, and an output connected to the collector of the first n-p-n transistor.

9. The amplifier of claim 8 further comprising:
a first capacitor having a first terminal to accept an unbiased ac input signal and a second terminal connected to the base of the first p-n-p transistor;
a first resistor having a first terminal connected to a third reference voltage having a higher voltage potential than the first reference voltage, and a second terminal connected to the base of the first p-n-p transistor; and,
wherein the base of the first p-n-p transistor accepts a first biased ac input signal.

10. The amplifier of claim 9 wherein the second terminal of the first capacitor and the second terminal of the first resistor are connected to the base of the first n-p-n transistor; and,
wherein the base of the first n-p-n transistor accepts the first biased ac input signal.

11. The amplifier of claim 9 further comprising:
a second capacitor having a first terminal to accept the unbiased ac input signal and a second terminal connected to the base of the first n-p-n transistor;
a second resistor having a first terminal connected to a fourth reference voltage having a higher voltage potential than the first reference voltage, and a second terminal connected to the base of the first n-p-n transistor; and,
wherein the base of the first n-p-n transistor accepts a second biased ac input signal.

12. The amplifier of claim 8 further comprising:
a first capacitor having a first terminal to accept an unbiased ac input signal and a second terminal connected to the base of the first n-p-n transistor;
a first resistor having a first terminal connected to a third reference voltage having a higher voltage potential than the first reference voltage, and a second terminal connected to the base of the first n-p-n transistor; and,
wherein the base of the first n-p-n transistor accepts a first biased ac input signal.

13. A linear emitter follower amplifier comprising:
a first p-n-p transistor having a base to accept an ac input signal, a collector, and an emitter to supply an ac output signal;
a first n-p-n transistor having a base to accept an ac input signal, an emitter connected to the collector the first p-n-p transistor, and a collector;
a second p-n-p transistor having a collector connected to the emitter of the first p-n-p transistor, a base connected to the collector of the first n-p-n transistor, and an emitter connected to a first reference voltage;
a third p-n-p transistor having a collector and base connected to the collector of the first n-p-n transistor, and an emitter connected to the first reference voltage; and,
a current source having an output connected to a second reference voltage having a lower voltage potential than the first reference voltage, and an input connected to the collector of the first p-n-p transistor.

14. The amplifier of claim 13 further comprising:
a first capacitor having a first terminal to accept an unbiased ac input signal and a second terminal connected to the base of the first n-p-n transistor;
a first resistor having a first terminal connected to a third reference voltage having a lower voltage potential than the first reference voltage, and a second terminal connected to the base of the first n-p-n transistor; and,
wherein the base of the first n-p-n transistor accepts a first biased ac input signal.

15. The amplifier of claim 14 wherein the second terminals of the first capacitor and first resistor are connected to the base of the first p-n-p transistor; and,
wherein the base of the first p-n-p transistor accepts the first biased ac input signal.

16. The amplifier of claim 14 further comprising:

a second capacitor having a first terminal to accept the unbiased ac input signal and a second terminal connected to the base of the first p-n-p transistor;

a second resistor having a first terminal connected to a fourth reference voltage having a lower voltage potential than the first reference voltage, and a second terminal connected to the base of the first p-n-p transistor; and, wherein the base of the first p-n-p transistor accepts a second biased ac input signal.

17. The amplifier of claim 13 further comprising:

a first capacitor having a first terminal to accept an unbiased ac input signal and a second terminal connected to the base of the first p-n-p transistor;

a first resistor having a first terminal connected to a third reference voltage having a lower voltage potential than the first reference voltage, and a second terminal connected to the base of the first p-n-p transistor; and, wherein the base of the first p-n-p transistor accepts a first biased ac input signal.

\* \* \* \* \*